United States Patent [19]

Ugenti et al.

[11] Patent Number: 4,779,042

[45] Date of Patent: Oct. 18, 1988

[54] COMPUTER-AIDED PROBE WITH TRI-STATE CIRCUITRY TEST CAPABILITY

[75] Inventors: Michael Ugenti, Melville, N.Y.; Richard Caiola, Bethel, Conn.

[73] Assignee: Grumman Aerospace Corporation, Bethpage, N.Y.

[21] Appl. No.: 945,636

[22] Filed: Dec. 23, 1986

[51] Int. Cl.[4] .................. G01R 13/32; G06F 11/00
[52] U.S. Cl. .......................... 324/73 R; 324/73 AT; 371/20; 371/25
[58] Field of Search .............. 324/73 R, 72.5, 133, 324/73 AT; 307/360, 473, 498, 261; 328/150; 371/20, 25

[56] References Cited

U.S. PATENT DOCUMENTS

| | | | |
|---|---|---|---|
| 3,513,400 | 5/1970 | Russell | 328/150 X |
| 3,525,939 | 8/1970 | Cartmell | 324/72.5 X |
| 3,543,154 | 11/1970 | Gordon | 324/72.5 X |
| 3,628,141 | 12/1971 | Union et al. | 324/72.5 X |
| 3,633,100 | 1/1972 | Hellwell et al. | 324/73 |
| 3,662,193 | 5/1972 | Braddock | 307/473 X |
| 3,681,614 | 8/1972 | Kroos | 307/203 |
| 3,683,284 | 8/1972 | Mueller | 307/360 X |
| 3,742,351 | 6/1973 | Palmer et al. | 324/72.5 X |
| 3,750,015 | 7/1973 | Sheker et al. | 324/72.5 X |
| 3,838,339 | 9/1974 | Brandt | 324/133 X |
| 3,845,328 | 10/1974 | Hollingsworth | 307/473 X |
| 3,903,471 | 9/1975 | Hiraga et al. | 324/133 X |
| 3,944,921 | 3/1976 | Tsuda et al. | 324/133 X |
| 3,952,247 | 4/1976 | Horichi | 324/96 X |
| 4,016,492 | 4/1977 | Miller, Jr. et al. | 324/72.5 X |
| 4,038,598 | 7/1977 | Kapfer | 324/72.5 X |
| 4,145,651 | 3/1979 | Ripingill, Jr. | 324/133 X |
| 4,189,673 | 2/1980 | Shintaku | 324/133 X |
| 4,291,356 | 9/1981 | Mathieu | 307/360 X |
| 4,403,183 | 9/1983 | Lueker | 324/72.5 |
| 4,418,314 | 11/1983 | Nieto, Jr. | 324/72.5 |
| 4,465,944 | 8/1984 | Shin | 307/473 X |
| 4,480,200 | 10/1984 | Tan et al. | 307/360 X |

OTHER PUBLICATIONS

IBM Technical Disclosure Bulletin, "TIL/FET Logic Probe Front-End Circuitry," vol. 17, No. 11, Apr. 1975, pp. 3379-3380.
IBM Technical Disclosure Bulletin, "Universal Probe Point," vol. 19, No. *, Jan. 1977, pp. 2830-2831.

Primary Examiner—Reinhard J. Eisenzopf
Assistant Examiner—Vinh P. Nguyen
Attorney, Agent, or Firm—Pollock, VandeSande & Priddy

[57] ABSTRACT

A probe is connected to a tri-state circuit which generates a programmable dc voltage to be impressed on a circuit node by the probed tip. Memory is provided for storing any change in tip voltage signifying a fault in the tri-state test. A separate circuit detects programmable data levels to eliminate gray area ambiguities. Further, a quick-check circuit determines whether a node is short circuited by determining whether toggling can occur at a node.

2 Claims, 3 Drawing Sheets

COMPUTER-AIDED PROBE WITH TRI-STATE CIRCUITRY TEST CAPABILITY

FIELD OF THE INVENTION

The present invention relates to electronic circuit testing apparatus, and more particularly to a computer-aided probe for checking tri-state circuitry as well as digital and analog circuits.

BRIEF DESCRIPTION OF THE PRIOR ART

In co-pending patent application Ser. No. 548,612, filed Nov. 4, 1983, and assigned to the present assignee, a computer-aided probe is disclosed for facilitating the testing of electronic circuits.

Briefly, the prior art device operates by regulating the supply voltage to at least one current driver, the output of which supplies current pulses. The current driver becomes saturated in response to pulses on its input. Regulation of the supply voltage is by means of a digital data register for storing a digital representation of the desired voltage level of the injected current and a digital-to-analog converter responsive to the data register.

The same reference voltage used to supply the current driver is used to derive a threshold voltage for a voltage comparator feedback loop which controls the width of the injected pulses in accordance with the impedance of the circuit being tested.

Dual current injecting current drivers are employed, allowing current pulses to be injected at two different reference voltage levels, typically the low and high logic levels of the circuit being tested. Thus, the prior art device may be used to test circuits employing any type of logic, and is not limited to logic families, such as TTL and CMOS, which utilize roughly equivalent logic levels.

Although the prior art probe has been found to be most useful in diagnosing faulty integrated circuits, its success now mandates increased capabilities.

BRIEF DESCRIPTION OF THE PRESENT INVENTION

The present computer-aided probe is an improvement over the prior art discussed and includes additional capabilities. The present invention includes a tri-state circuit for detecting the high impedance condition of tri-state logic. The present probe is capable of operating at a high speed (50 mHz) and incorporates a dual threshold detector circuit which allows gray area detection. The probe is capable of detecting pulses as well as providing a quick check of circuit nodes to determine whether a toggling signal is present thereat.

By virtue of the present improvement, faults may be more accurately detected when the circuitry is operating at high data rates, such as 50 mHz. A probe may be placed in direct contact with integrated circuit nodes without damage thereto.

When using the present invention, it has been found that it is possible to detect dual threshold data levels to within 100 millivolt accuracy for inputs of ±30 volts. Further, pulses are detectable when pulse widths exceed 20 nanoseconds.

The present invention includes a quick-check circuit to determine whether toggling occurs at a particular node; that is, whether both logic levels of an ordinary digital signal may be present at a node. For more in-depth tests, if it is necessary to determine the timing of the toggling, a memory is provided so that comparisons of signal switching at a particular node, versus a reference signal, can be made. All comparisons of test data picked up from the probe are accomplished in a central processing unit (CPU).

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
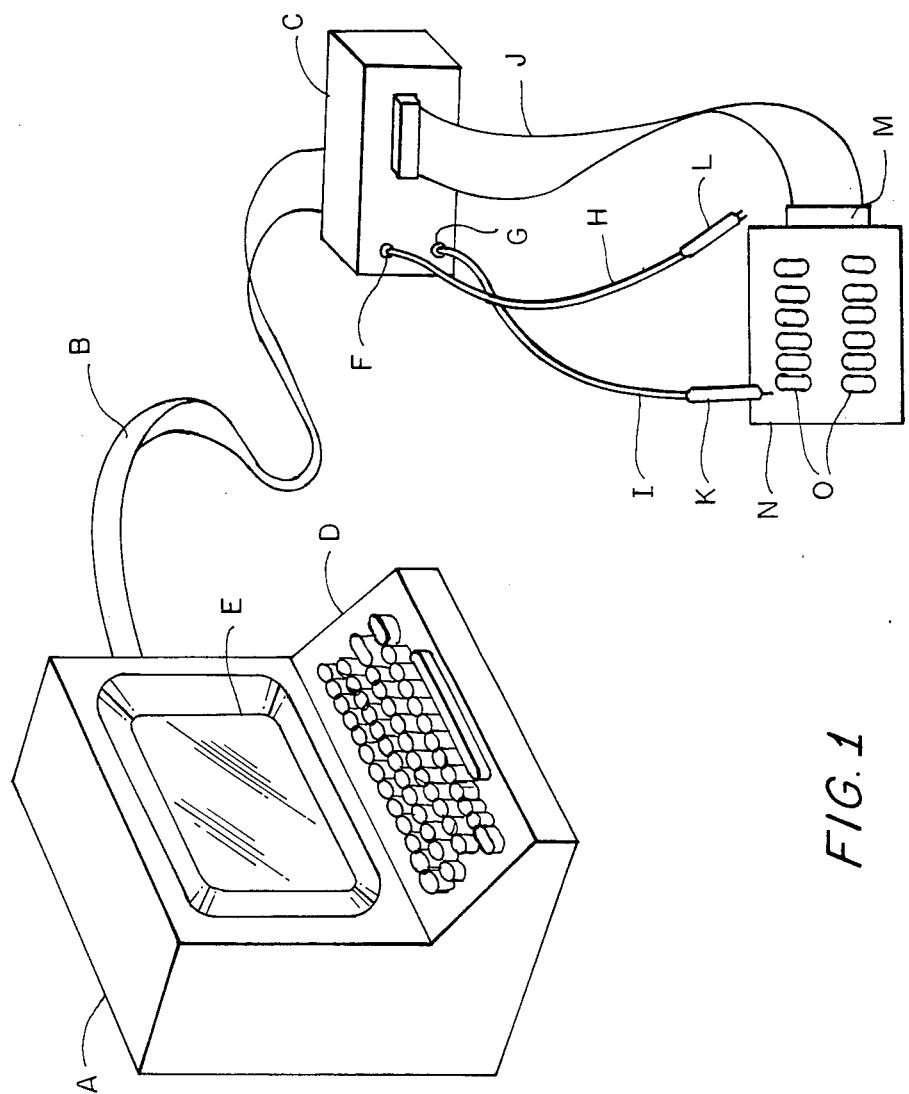
FIG. 1 is a perspective view of a system embodying a prior art invention.

Prior to an explanation of the improved probe circuitry constituting the present invention, reference is made to FIG. 1 wherein the probe system of the mentioned co-pending application is illustrated.

The major components of a circuit testing system incorporating the prior art invention are illustrated in FIG. 1. Programmable computer A, typically a microcomputer, communicates, as indicated by ribbon cable B, with an interface unit C. As shown, computer A includes a keyboard input D and a video display E; and interface unit C includes connecting ports F and G for probe cables H and I and parallel ribbon cable J. In turn, cables H and I are connected to hand-held probes K and L, respectively; and parallel cable J terminates in an edge card plug M.

The printed circuit card N to be tested typically includes a multiplicity of integrated circuit chips O. The standardized plug allows the circuit card N to be conveniently inserted into or removed from (as for testing, system enhancement or repair) a corresponding edge card receptacle in a host device employing the card. As shown, card N is connected to plug M to allow transmission of predetermined test signals and responses over cable J.

Application of the predetermined test signals to the input conductors and interpretation of the responses sensed on the output conductors of the edge card are controlled by computer A. Thus, a program for computer A corresponding to the specific circuitry of card N must appropriately embody the predetermined test signals and associated response analysis logic. Such a program may be derived in part by applying test signals to a known good circuit and recording the response. Another consideration in the programming of computer A is compatibility with the hardware of interface unit C. Those skilled in the art will appreciate that interface unit C will include data buffers, timing logic, voltage supplies, etc., each associated with appropriate conductors in cable J to allow simulated operation of the host device.

Probes K and L each have a tip sized to allow positioning by a user of the system over the individual pins of circuit chips O. Use of the probes in a given test procedure allows access to nodes and branches on the circuit card N which are not connected directly to the edge card plug, facilitating the precise identification of faulty chips. The construction and associated circuitry of each probe makes possible a generalized test procedure adaptable to a variety of circuit cards.

Figure 2:
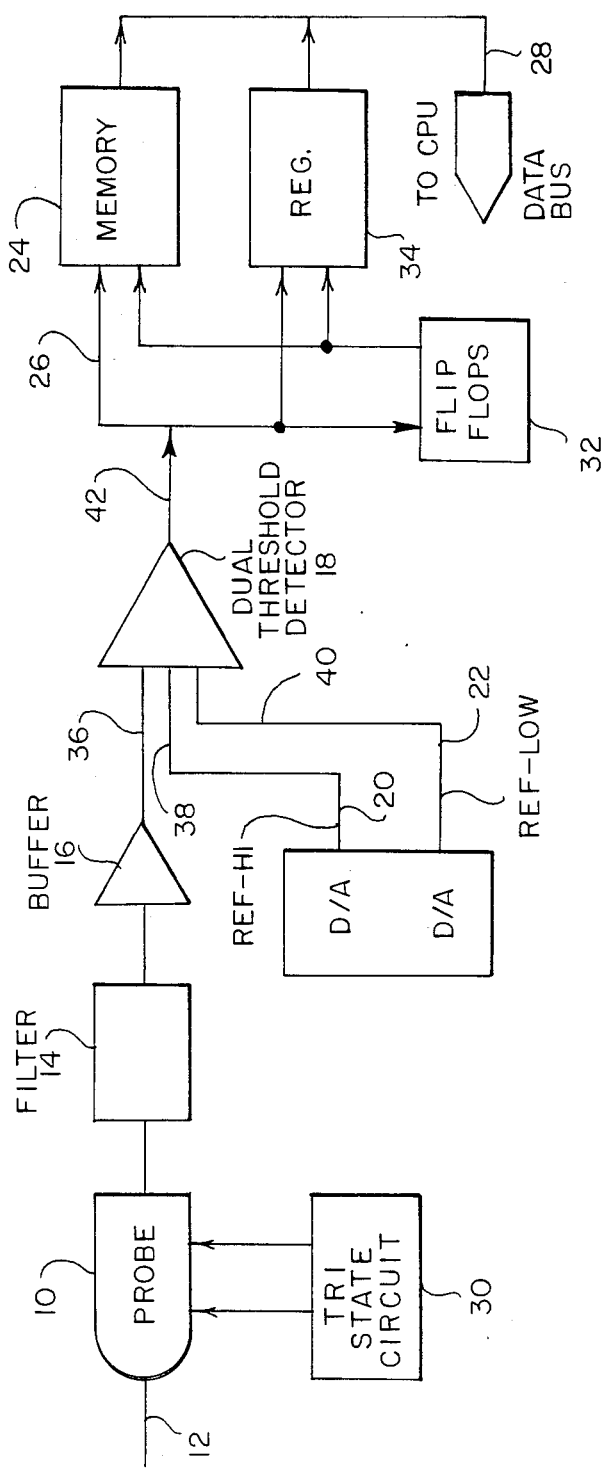
FIG. 2 is a block diagram of the present invention.

Now considering the present invention, the basic block diagram is illustrated in FIG. 2, wherein probe 10 is shown connected to a number of externally connected ancillary circuits which accomplish the improved goals of the invention.

Probe 10 has a metallic tip 12 for contacting nodes and branches of circuits undergoing testing. The output from probe 10 is input to a conventional filter 14 for performing wave shaping of the probe output. This reduces the erroneous effect of noise in the processing of probe signals. The filtered output is then stored in buffer 16 and, when read out of the buffer, is subjected to dual threshold detection by dual threshold detector 18. Dual threshold detection is accomplished by providing the detector 18 with high and low input reference signals at 20 and 22, respectively. The inclusion of the dual threshold detector circuit allows gray area detection by permitting pulses of the probe output, occurring between preselected high and low reference switching levels, to be processed. Further detailed operation of the detector 18 will be discussed hereinafter.

Once the probe output signal has undergone dual threshold detection, a number of alternatives are possible. The signals may be stored in memory 24 and compared on a time basis with an expected test response. The actual comparison is performed by a central processing unit (CPU) which is connected to the output of conventional memory 24 by a data bus 28.

A flip-flop circuit 32, functioning as a pulse detector, is connected to the output of the dual threshold detector 18. The flip-flop circuit 32 will trigger on the rising and falling edges of pulses provided at the output 42 of dual threshold detector 18. The output from the flip-flop circuit 32 may be connected, via line 26, directly to memory 24 for later comparison with an expected or prototype signal profile; or alternatively, the output from flip-flop circuit 32 may be provided to a register 34 which performs a quick check function which permits the system to simply determine whether a contacted node of a circuit undergoing test is carrying binary signals. For example, if a particular node contacted is short circuited, the register 34 would not load trigger signals from flip-flop circuit 32, thereby indicating a faulty node.

Figure 4:
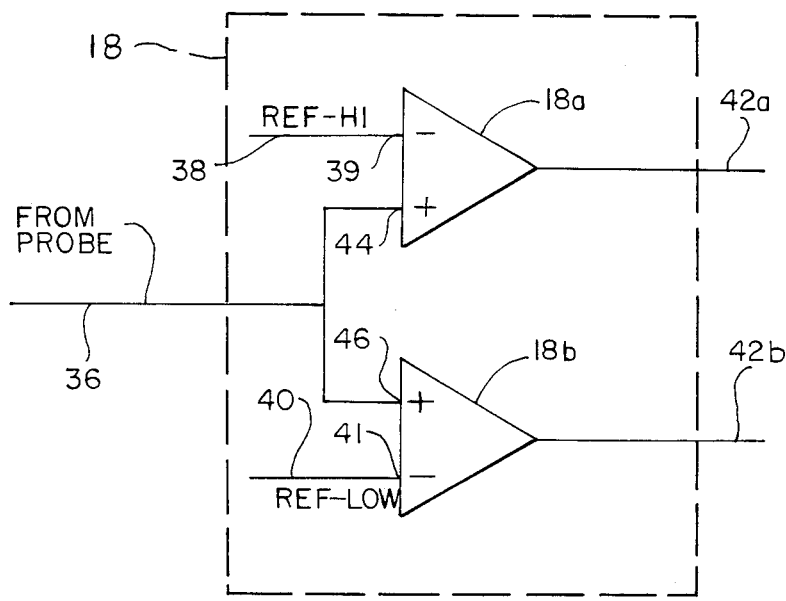
FIG. 4 is a logic diagram of a dual threshold detector.

Reference is made to FIG. 4 wherein the dual threshold detector 18 is shown in greater detail. Basically, the detector is comprised of two comparators 18a and 18b. The negative terminal 39 of the first comparator 18a is connected to a dc level which serves as a high voltage reference (REF-HI). The second comparator 18b has its negative terminal 41 connected to a low reference dc level (REF-LOW) present on input lead 40. The input high and low reference levels are programmable by utilizing programmable dual digital-to-analog (D/A) converters (FIG. 2) which furnish the reference signals in accordance with digital signals from a computer. Typically, the high and low reference signals are programmed to bracket the anticipated signal level from the probe. Thus, if the signal from the probe is between the two references, the dual threshold detecting circuit will switch successfully and succeed in gray area detection. This will be seen more clearly from FIG. 4 wherein the buffered signal from the probe is introduced at input line 36 to parallel connected positive terminals 44 and 46 of respective comparators 18a and 18b. If the signal level along input line 36 is between the reference high or reference low voltages on input lines 38 and 40, a signal will appear at dual threshold detector circuit output 42a or 42b.

Figure 3:
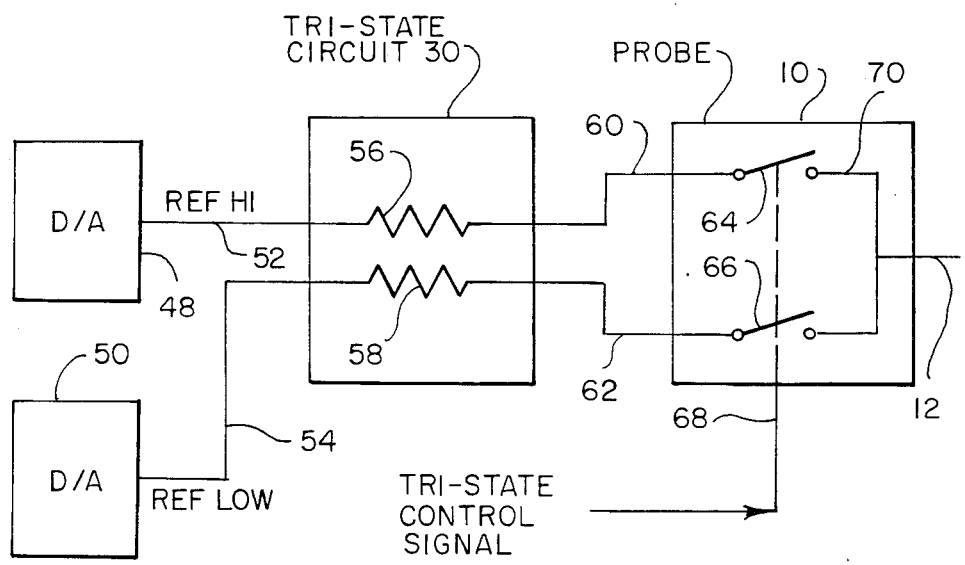
FIG. 3 is a block diagram of a tri-state circuit.

When tri-state conditions are to be checked on a circuit undergoing test, the tri-state circuit 30 (FIG. 2) becomes actuated for cooperation with the probe. Referring to FIG. 3, programmable high level and low level dc reference voltages are generated along lines 52 and 54 by programmable digital-to-analog (D/A) converters 48 and 50, which are similar to the converters of the dual threshold detector 18 explained in connection with FIG. 2. The tri-state circuit 30 includes a matched pair of resistors 56 and 58 which feed the respective high and low reference voltages (dc levels) along parallel paths. When tri-state operation of the probe is intended, a tri-state control signal is generated by a CPU along control line 68, which closes a double-pole relay switch and corresponding contacts 64 and 66. Upon closure of the contacts, the voltages across resistors 56 and 58 are parallel added and connected to the probe 10 via lines 60 and 62. By way of example, in the event the reference high and reference low dc levels are respectively two volts and one volt, the output probe voltage will be 1.5 volts. The tri-state circuit 30 is easily changed by programming the reference dc levels to appropriate values which will give the desired tip voltage after being parallel added through resistors 56 and 58.

In order for a tri-state node to be tested in a circuit undergoing testing, the metallic probe tip 12 is brought into contact with the tri-state node; and since the node is to appear in a tri-state condition (high impedance open circuit), the tip voltage after contact with the node will remain the same as opposed to being decreased due to impedance loading, thereby signifying a positive tri-state test. During such testing the dual threshold detector 18 is programmed to pass the tri-state test voltage of the probe tip and any change in tip voltage will be stored in memory 24. A CPU communicates the stored information via data bus 28, thereby successfully concluding the tri-state test of a node.

It should be understood that the invention is not limited to the exact details of construction shown and described herein, for obvious modifications will occur to persons skilled in the art.

We claim:

1. A computer-aided network comprising:
   a dual threshold detector having a signal input, a high reference input, and a low reference input;
   probe means having a tip for contacting circuit check points;
   means connecting the detector signal input to the probe;
   first programmable means for generating analog high and low reference signals for the high and low reference inputs of the detector; and
   memory means connected to the output of the detector for storing an output signal from the detector signifying the detection of a probe signal level between the low and high reference values;
   a circuit for checking tri-state operation of a circuit check point, the circuit comprising:
   first and second resistive means respectively connected to the high and low reference signals;
   switch means connecting the resistive means in parallel to a probe tip for producing a programmable voltage at the tip;

wherein the tip voltage remains substantially constant when the tip contacts a circuit check point operating in a tri-state condition;

the network further including trigger means connected to the detector output for generating a toggling signal in response to sequentially alternating pulses at the detector output signifying that a circuit check point is producing a normal binary signal.

2. The structure set forth in claim 1 wherein the detector comprises:

first and second comparators having their first inputs connected in parallel; and their second inputs connected to respective high and low reference inputs.

* * * * *